(12) United States Patent
Sibrai

(10) Patent No.: US 6,982,601 B2
(45) Date of Patent: *Jan. 3, 2006

(54) HIGH ISOLATION/HIGH SPEED BUFFER AMPLIFIER

(75) Inventor: Andreas Sibrai, Krottendorf (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/969,519

(22) Filed: Oct. 20, 2004

(65) Prior Publication Data

US 2005/0052240 A1 Mar. 10, 2005

Related U.S. Application Data

(63) Continuation of application No. 10/304,785, filed on Nov. 26, 2002, now Pat. No. 6,819,182.

(30) Foreign Application Priority Data

Nov. 7, 2002 (EP) .................................. 02392018

(51) Int. Cl.
*H03F 3/04* (2006.01)
(52) U.S. Cl. ...................... 330/288; 330/264; 330/301; 327/52; 327/53; 327/108; 327/109
(58) Field of Classification Search ................ 330/302, 330/301, 288, 264; 327/52, 53, 108, 109
See application file for complete search history.

(56) References Cited

U.S. PATENT DOCUMENTS

| | | | | |
|---|---|---|---|---|
| 4,312,060 A | * | 1/1982 | Grodinsky | .................. 369/134 |
| 5,179,355 A | * | 1/1993 | Harvey | ........................ 330/265 |
| 5,578,967 A | * | 11/1996 | Harvey | ........................ 330/263 |
| 5,714,914 A | | 2/1998 | Zhou | ...................... 331/117 R |
| 5,933,057 A | * | 8/1999 | Tchamov et al. | ............ 330/302 |
| 5,960,334 A | | 9/1999 | Nakano | ................... 455/188.1 |
| 5,982,236 A | * | 11/1999 | Ishikawa et al. | ............. 330/296 |
| 6,163,222 A | | 12/2000 | Kobayashi | ................... 330/302 |

FOREIGN PATENT DOCUMENTS

JP          35313866        * 12/1978

OTHER PUBLICATIONS

Mucha, "Fully Differential Current Conveyor based CMOS Operational Amplifier", International Journal of Electronics 1994, vol. 74, No. 5, pp 697-703.*

* cited by examiner

*Primary Examiner*—Michael B Shingleton
(74) *Attorney, Agent, or Firm*—George O. Saile; Stephen B. Ackerman

(57) ABSTRACT

A method and circuits of a high isolation and high-speed buffer amplifier capable to handle frequencies in the GHz range have been achieved. The output to input isolation is primary dependent on the gate-source capacitance of the active buffer transistor. Having two or more in series and by reducing the impedance between them a high isolation can be achieved. The input signals are split in several signal paths and are amplified in the push-pull mode using source follower amplifiers. Then the amplified signals are being combined again. The amplified output current is mirrored applying a multiplication factor. Said method and technology can be used for buffer amplifiers having differential input and differential output or having single input and single output or having differential input and single output. A high reversed biased (output to input) isolation and a reduced quiescent current have been achieved.

9 Claims, 6 Drawing Sheets

HIGH ISOLATION/HIGH SPEED BUFFER AMPLIFIER

This is a continuation of patent application Ser. No. 10/304,785, filing date Nov. 26, 2002, "High Isolation/High Speed Buffer Amplifier", now U.S. Pat. No. 6,819,182, assigned to the same assignee as the present invention, which is herein incorporated by reference in its entirety.

BACKGROUND OF THE INVENTION (1) Field of the Invention

This invention relates generally to high-speed amplifiers and relates more particularly to buffer amplifiers used in communication devices to amplify the signals of a voltage-controlled oscillator (VCO) and to isolate said VCO from a load connected to said amplifier in a frequency range of GHz as for e.g. the Bluetooth technology.

(2) Description of the Prior Art

Modern wireless communication devices use high-frequency signals: 900 MHz to 1900 MHz for cellular phones and higher, up to 6 GHz, for other systems, such as wireless LANs. For example, radios for the "Bluetooth" standard" operate in the unlicensed Industrial, Scientific and Medical (ISM) band at 2.4 GHz. Signals at such frequencies are difficult to generate and to control. They have also a tendency to interfere with each other, as they are easily coupled by parasitic properties present in all electronic components, including integrated circuits A buffer amplifier is designed to follow low-level stages. This will then present a sufficiently high enough input impedance so it is not considered a significant load to that stage. The intermediate or buffer amplifier stage, while not representing a load must then have a sufficiently low output impedance to drive successive stages. One example for such a low level stage is a voltage-controlled oscillator. An oscillator for optimum performance cannot be loaded down, it needs an intermediate stage following. This will then present a sufficiently high enough input impedance so it is not considered a significant load to the oscillator. The intermediate or buffer stage, while not representing a load must then have a sufficiently low output impedance to drive successive stages A buffer amplifier is often used to amplify the signals of a VCO and to isolate the VCO from a load connected to the buffer amplifier. For a usage in the GHz frequency range the reverse biased (output to input) isolation should be in the range of 20–30 dB. The quality of said isolation has direct influence on the quality of the VCO signals. The power consumption of said buffer amplifier is another important attribute. Designing such a system is still a challenge for the designer.

U.S. Pat. No. 6,163,222 (to Kobayashi) teaches a buffer amplifier to be connected to an oscillator for outputting an oscillation signal, comprising an amplifier circuit for amplifying the level of the oscillation signal and frequency selective means connected to the output terminal of the amplifier circuit, wherein the fundamental harmonic or the secondary higher harmonic of the oscillation signal is outputted by switching the frequency selective means.

U.S. Pat. No. (5,714,914 to Zhou) discloses a high power, low noise voltage-controlled oscillator (VCO) in a transmitter such as a cellular radiotelephone. The VCO includes a resonant circuit, an active part connected to the resonant circuit, and a buffer amplifier, connected to the active part, for isolating the VCO from a load connected to the buffer amplifier. The buffer amplifier is a linear amplifier including a transistor, and the active part and the buffer amplifier may be connected by a capacitance for reducing coupling between the active part and the buffer amplifier.

U.S. Pat. No. (5,960,334 to Nakano) shows an amplifier for amplifying a local oscillation signal of a receiving section or a carrier signal of a transmitting section and a portable telephone apparatus using this amplifier. Said amplifier comprises an amplifying transistor, a parallel resonance circuit, a bypass capacitor and a switching means for switching between a connected state and a disconnected state of a connection point.

SUMMARY OF THE INVENTION

A principal object of the present invention is to achieve a high isolation and high-speed buffer amplifier capable to handle frequencies in the GHz range.

A further object of the present invention is to achieve said buffer amplifier consuming minimal power.

A further object of the present invention is to achieve a basic amplifier stage for said buffer amplifier to be applicable for different applications as differential ended input, single ended input, differential ended output and single ended output.

In accordance with the objects of the invention a circuit for a high isolation, high-speed buffer amplifier capable of handling frequencies in the range of GHz has been achieved. Said amplifier comprises a basic amplifier stage comprising amplifying means using the push-pull mode having an input and an output, wherein the input are signals to be amplified and the output current at the output node has a high reverse isolation from said input signals. Additionally means of power supply for said circuit and a current source for the bias current are provided.

In accordance with the objects of this invention a circuit for a high isolation, high-speed buffer amplifier capable of handling frequencies in the range of GHz having a differential ended input and a differential ended output has been achieved. Said amplifier comprises two basic amplifying stages comprising amplifying means using the push-pull mode having an input and an output, wherein the input are signals to be amplified and the output current at the output node has a high reverse isolation from said input signals. The output load is hooked up between the output nodes of said two basic amplifying stages. Additionally means of power supply for said circuit and a current source for the bias current is provided.

In accordance with further objects of the invention a circuit for a high isolation, high-speed buffer amplifier capable of handling frequencies in the range of GHz having a differential ended input and a single ended output has been achieved. Said amplifier comprises a first basic amplifier stage comprising amplifying means using the push-pull mode having an input and an output, wherein the input are signals to be amplified and the output current at the output node has a high reverse isolation from said input signals. Furthermore said amplifier comprises an input stage of a basic amplifier stage comprising amplifying means using the push-pull mode having an input and an output, wherein the input are signals to be amplified and the output is linked to said first basic amplifier stage. The output load is hooked up between the output node of said first basic amplifier stage and a node being capacitively coupled to ground. Additionally means of power supply for said circuit and a current source for the bias current is provided.

In accordance with further objectives of the invention a method to achieve a high isolation and high-speed buffer amplifier is achieved. Said method is comprising as first step to split a input signal in several paths, followed by amplifying the split signal in each signal path in several stages using source follower transistors, to combine again the split and amplified signals and to mirror the amplified output current applying a multiplication factor.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose circuits to achieve a buffer amplifier capable to work efficiently in the GHz frequency range. The reverse biased (output to input) isolation of a preferred embodiment is in the area of 20–30 dB. The high isolation is achieved by a 2-stage implementation. For such high frequencies, the output to input isolation is primary dependent on the gate-source capacitance of the active buffer transistor. Having two of said buffer transistors in series and by reducing the impedance between them, a high isolation is achieved.

Figure 1:
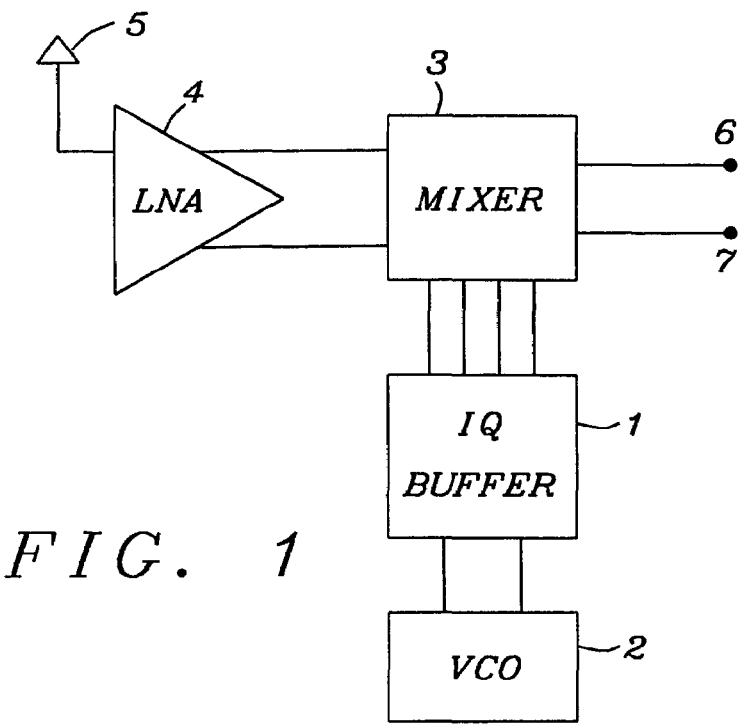
FIG. 1 illustrates a block diagram of a differential buffer amplifier as part of a front end of a wireless communication system.

FIG. 1 shows in a schematic diagram a buffer amplifier 1 hooked up to a voltage-controlled oscillator (VCO) 2 generating signals in the GHz frequency range. Said buffer amplifier is used to amplify e.g. the signals of said VCO and to isolate the VCO from a load connected to the buffer amplifier. Said buffer amplifier is part of a modern wireless communication device comprising also an antenna 5 receiving signals in the GHz frequency range and a low noise amplifier (LNA) 4 amplifying said signals. The output of said LNA and the output of said buffer amplifier is the input of a mixer 3. The output ports 6 and 7 of said mixer have a frequency range in the area of e.g. 10 MHz.

There are three kinds of applications of said buffer amplifiers. In all said applications the input of said buffer amplifier supplies high input impedance for a wide frequency range. The output in all the applications is supplying frequency dependent gain and true push-pull operation with a single or differential ended output drive. Said frequency dependent gain is being set where the gain for the load used and frequency range can be set.

Figure 2A:
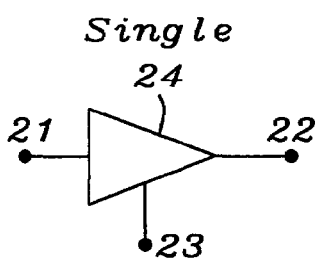
FIG. 2A shows a functional diagram of a buffer amplifier having a single ended input and a single ended output.

FIG. 2A shows a functional diagram of a basic block of a buffer amplifier 24 having a single ended input 21 and a single ended output 22. The signal levels needs to be capacity coupled and the gain set 23 can be referred to ground or to supply or both. This is a solution often in used in applications where the output signal is going off chip.

Figure 2B:
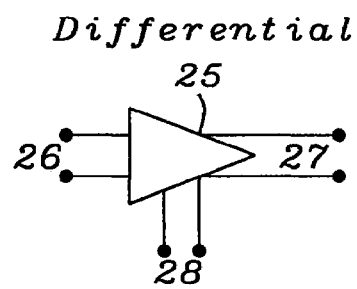
FIG. 2B shows a functional diagram of a buffer amplifier having a differential input and a single ended output.

FIG. 2B shows a buffer amplifier 25 having a differential ended input 26 and a differential ended output 27. In this mode two single basic blocks are in use, where the gain is set differentially 28 providing enhanced power supply rejection rate (PSRR). This is the best solution in applications a very high isolation is required as shown in FIG. 1 where said buffer amplifier is part of a wireless communication system operating at very high frequencies.

Figure 2C:
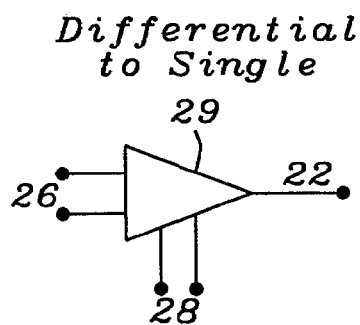
FIG. 2C shows a functional diagram of a buffer amplifier having a differential input and a single ended output.

FIG. 2C shows a buffer amplifier 29 having a differential ended input 26 and a single ended output 22. In this mode one complete basic amplifier block and the input part of a second basic amplifier block is required. The second block contains no output stage. The gain is set 28 again differentially. This solution can be used in applications where the output signal is going off-chip while the on-chip processing is performed in a differential mode optimizing the power supply rejection rate (PSRR).

Figure 3A:
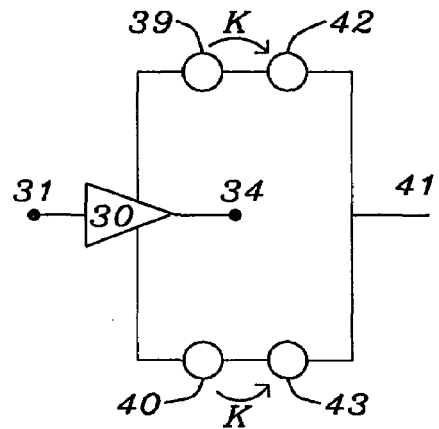
FIG. 3A shows a symbol of a basic amplifier stage

FIG. 3A shows a symbolic schematic of the basic amplifier stage invented. The signal is fed in node 31 and is passing through the input stage 30. The current through node 34 is mirrored with the multiplication factor K by the two current mirrors 39/42 and 40/43 to the output port 41.

Figure 3B:
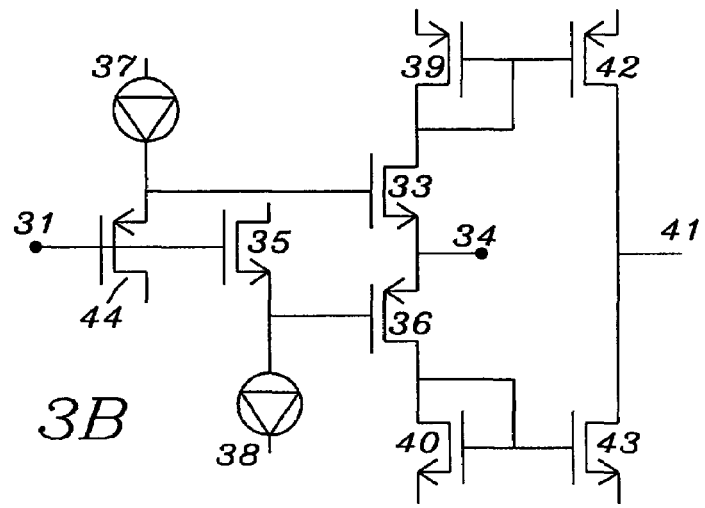
FIG. 3B illustrates the components of a basic amplifier stage

FIG. 3B shows in more detail said basic amplifier stage. Said input stage 30 and the current mirrors 39/42 and 40/43 are used in said three different applications as outlined in FIGS. 2A, B and C. The signal is fed in node 31. Then the signal is divided in two signal paths. The first signal channel is through the PMOS source follower 44 and the NMOS source follower 33; the second signal channel is through the NMOS source follower 35 and the PMOS source follower 36. Said two signal paths are combined in node 34 again. Said source followers are characterized by a voltage gain of less than unity, and feature a large current gain as a result of having a very large input impedance and a small output impedance. The advantage of this signal flow is, that the signal is not limited through the quiescent current supplied by the current sources 37 and 38. The quiescent current through transistors 39, 33, 36 and 40 is set by said current sources 37 and 38 following the ratio of the transistors 33 to 35 and the ratio of the transistors 36 to 44. Having a current ratio of 4, the transistors 44 and 35 can be 4 times smaller than 33 and 36. This results in higher input impedance at node 31 and better isolation between node 31 and node 34

Having node 41 as output, no signal would pass if node 34 is not loaded. Using said scaled current mirrors 39/42 and 40/43 the load on node 41 can be the ratio K of the current mirror smaller than the load on node 34. In a preferred embodiment the current mirror 39/42 and current mirror 40/43 have a multiplication factor K of 10, therefore a load of 500 Ohm at node 34 gives the same voltage swing as a 50 Ohm load at node 41. For reverse isolation of the signal, the signal has to pass transistors 42-39-33-44, or parallel 43-40-36-35. In prior art the reverse isolation of a standard buffer amplifier operating in the 2 GHz range is in the area of 7–10 dB. An isolation between 30 to 40 dB can be reached using the circuitry invented. The signal purity is dependent on quiescent current, or if "quasi push-pull" circuit techniques are in use, on the process variations of capacitors which needs additional silicon space. The significant reduction of the quiescent current in said circuit is causing a significant improvement of the signal purity.

In summary, the benefits of said basic amplifier stage are a reduction of the quiescent current, an enhancement of the reverse isolation, a reduction of silicon area and an enhancement of signal purity.

Figure 4:
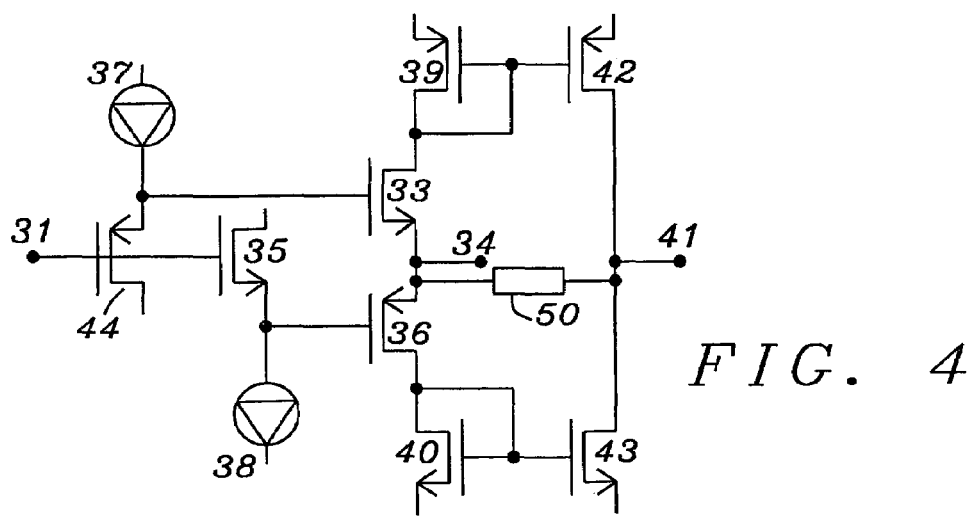
FIG. 4 illustrates the components of a basic amplifier stage having a stabilizing resistor.

The stability of the operation can be enhanced by using a stabilizing resistor as shown in FIG. 4. The offset generated between node 31 and node 34 is dependent on the $V_{gs}$ ratio of transistors 44 and 33 (resp.also 35 and 36). This can be compensated with a proper DC-biasing at node 31. The critical node is node 41. Because the same DC-current is flowing through transistor 39 and transistor 40, deviations from an ideal behaviour can only be caused by errors of the current mirror 39/42 or the current mirror 40/43. Said current mirror errors can cause node 41 to move to the supply voltage or to ground. If this happens, a signal is clipped in the positive or negative swing. To solve this problem, a compensating resistor $R_{comp}$ 50 can be built between nodes 34 and 41 to compensate this erroneous current, so node 41 will be close to the voltage of node 34. The difference is $Vdiff_{34\_41}=I(node_{41}(DC))*R_{comp}$. Said voltage difference is linearly dependent from said compensating resistor $R_{comp}$ 50. The drawback of introducing this resistor is that the amplification is reduced.

Figure 5:
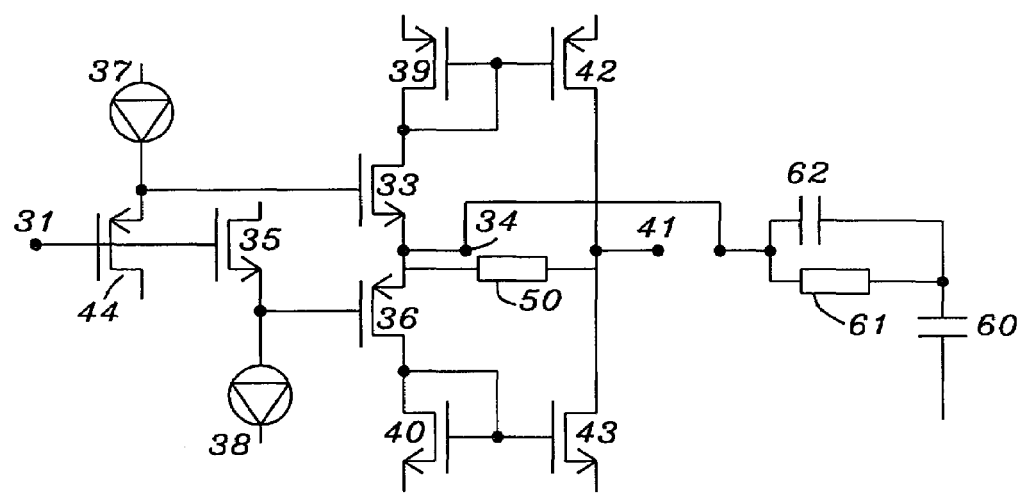
FIG. 5 illustrates the components of a basic amplifier stage having the capability of gain setting.

FIG. 5 shows how a frequency dependent gain setting can be performed. For the single stage, node 34 has a voltage that is between ground and the battery supply. Because of its dynamic biasing, node 34 is not exactly at half the supply. Therefore a capacitive coupling is required. The capacitor 60 is used for said capacitive coupling. Said capacitor 60 determines the lower cut-off frequency. In the required frequency range where gain is needed, resistor 61 sets the gain. The capacitor 62 can enhance the amplification and widen the bandwidth by reducing the effective resistance of resistor 61 with its frequency dependent impedance.

In summary, the benefits of the frequency dependent gain setting illustrated is that the amplifier gain can be limited to a small frequency range, the noise bandwidth is reduced and using capacitor 62 the maximum frequency can be increased.

Figure 6:
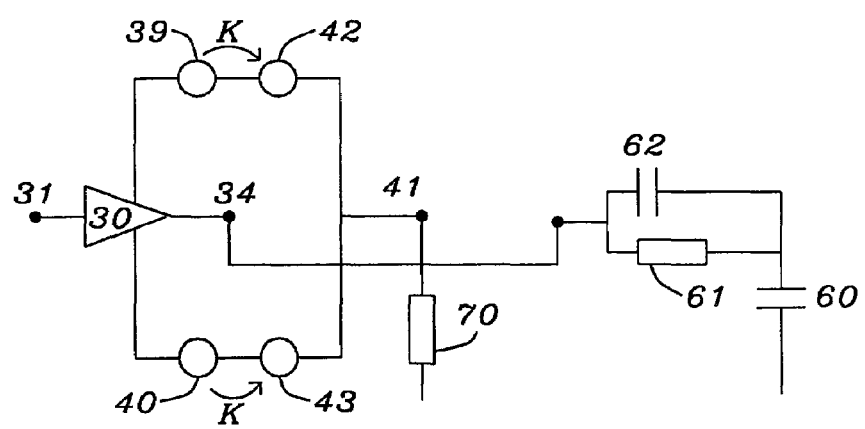
FIG. 6 illustrates the operation and the gain setting of a buffer amplifier having single ended input and single ended output.

Using again the symbolic schematic of the basic amplifier stage invented as shown in FIG. 3A, the gain setting and the operation in single mode is described in FIG. 6. The signal is fed in node 31 and, passing through the input stage 30, is driving the load at the output impedance 70 hooked up at the output port 41. For higher frequencies, with capacitor 60 acting as virtual ground, the current produced by resistor 61 and capacitor 62 is mirrored and multiplied K times to the output node 41. Node 34 is acting as a buffer referred to node 31. Therefore the gain is directly dependent on the input voltage, the ratio between the load at node 34 and the load at node 41 and also from the current multiplying factor K.

Figure 7:
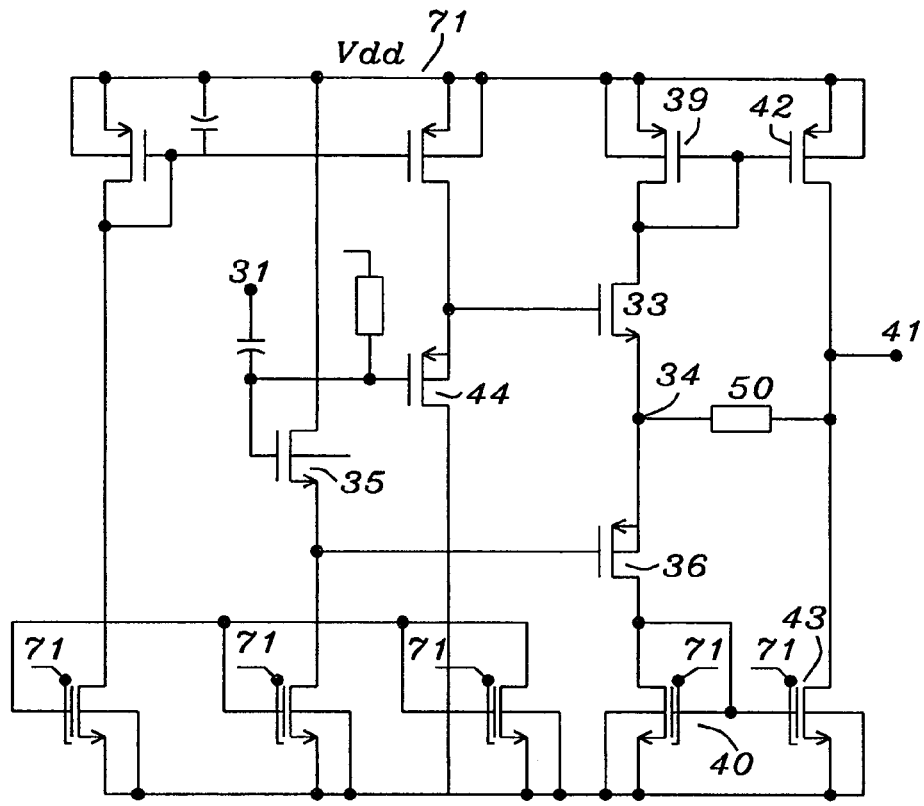
FIG. 7 is a circuit diagram of a buffer amplifier having a single ended input and a single ended output.

FIG. 7 shows a schematic circuit diagram of a preferred embodiment of a buffer amplifier having a single ended input and a single ended output as it has been shown principally in FIG. 2A and in more detail in FIG. 6 and in FIG. 3B. The supply voltage $V_{dd}$ is represented by 71. Only the relevant components are explained in here. FIG. 7 illustrates how a basic amplifier block as shown in FIG. 3B is implemented in a circuit of a buffer amplifier. The same numbers are used for the same components as in the previous figures. The circuitry supplying the biasing current is not shown for the sake of clarity. The input port for the single ended signal is node 31. Said input signal is divided into two parallel signal paths, the first path is through the source follower transistors 44 and 33, the second path is through the source followers 35 and 36. The signals are combined at node 34 again. The current through node 34 is mirrored by the current mirrors 39/42 and by the mirrors 40/43 as described in FIG. 3B. A stabilizing resistor $R_{comp}$ 50 is hooked up between node 34 and the output node 41 as described in FIG. 4. The delivered output power is not directly related to the quiescent current, because all current needed for the signal swing is based on the gain $g_m$ of the active transistors.

Figure 8:
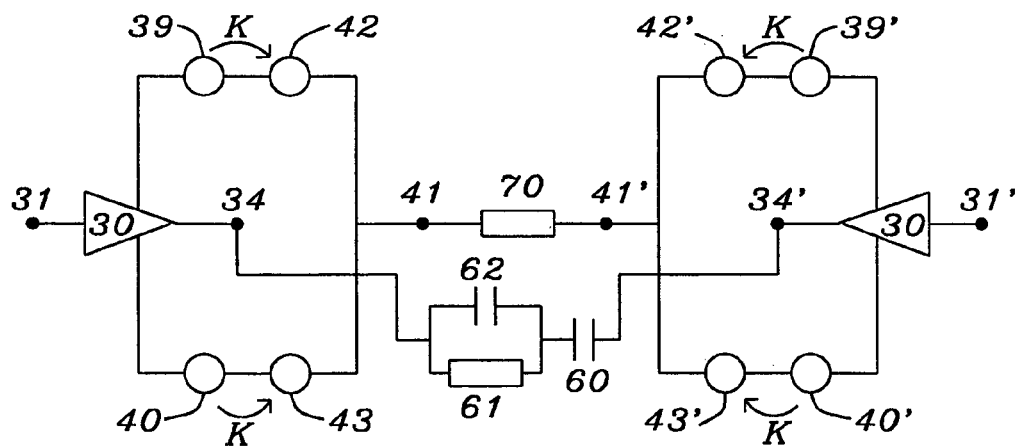
FIG. 8 illustrates the operation and the gain setting of a buffer amplifier having differential input and differential output.

Using again the symbolic schematic of the basic amplifier stage invented as shown in FIG. 3A, the gain setting and the operation in differential mode is described in FIG. 8. The differential mode, as described in FIG. 2B, has a differential ended input and a differential ended output. In this mode two single basic amplifier blocks are linked together. The signal input is differential between node 31 and 31', passing the input stages 30. The output is differential between node 41 and node 41'. The load impedance 70 represents the output load. The gain and frequency setting is between node 34 and 34'. Again capacitor 60 sets the lower frequency, resistor 61 sets the mid-band gain and capacitor 62 is used to widen the bandwidth to higher frequencies or to increase the gain at a given frequency. Due to the fully differential path the power supply rejection rate (PSRR) is optimized. The basic amplifier stage is insensitive to substrate or supply effects because the reference point 34 resp. 34' is not referred to the ground or the supply.

Figure 9:
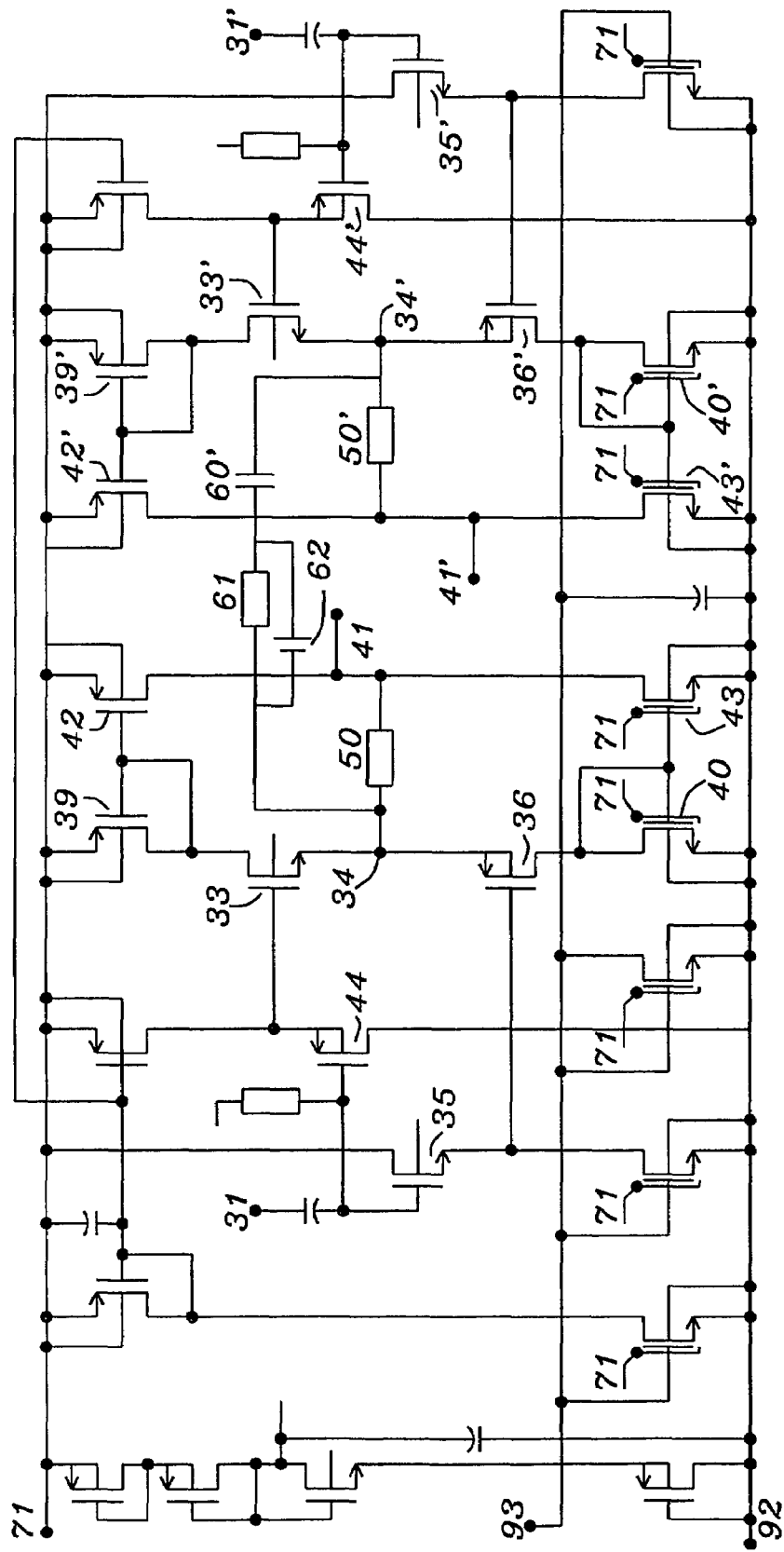
FIG. 9 is a circuit diagram of a buffer amplifier having a differential input and a differential output.

FIG. 9 shows a schematic circuit diagram of a preferred embodiment of a buffer amplifier having a differential ended input and a differential ended output as it has been shown principally in FIG. 2B and in more detail in FIG. 8. Two basic amplifier blocks as outlined in FIG. 3B have been linked together in this circuit. The supply voltage Vdd is represented by 71, the supply voltage $V_{ss}$ by 92, the supply of the bias current by 93. Only the relevant components are explained in here. The same numbers are used for the same components as in the previous figures. The two input ports for the differential ended signals are node 31 resp. 31'. Said input signals are divided in two parallel signal paths each, the first path is through the source follower transistors 44 and 33 (resp. 44' and 33'), the second path is through the source followers 35 and 36 (resp. 35' and 36'). The signals are combined at node 34 (resp. 34') again. The current through node 34 (resp. 34') is mirrored by the current mirrors 39/42 (resp. 39'/42') and by the mirrors 40/43 (resp. 40'/43') as described in FIG. 3B. A stabilizing resistor $R_{comp}$ 50 (resp. 50') is hooked up between node 34 (resp. 34') and the output node 41 (resp. 41') as described in FIG. 4. The gain and frequency setting are based between node 34 and 34'. Capacitor 60 sets the lower frequency, resistor 61 sets the mid-band gain and capacitor 62 is used to widen the bandwidth to higher frequencies or to increase the gain at a given frequency. The delivered output power is not directly related to the quiescent current, because all current needed for the signal swing is based on the gain $g_m$ of the active transistors.

Figure 10:
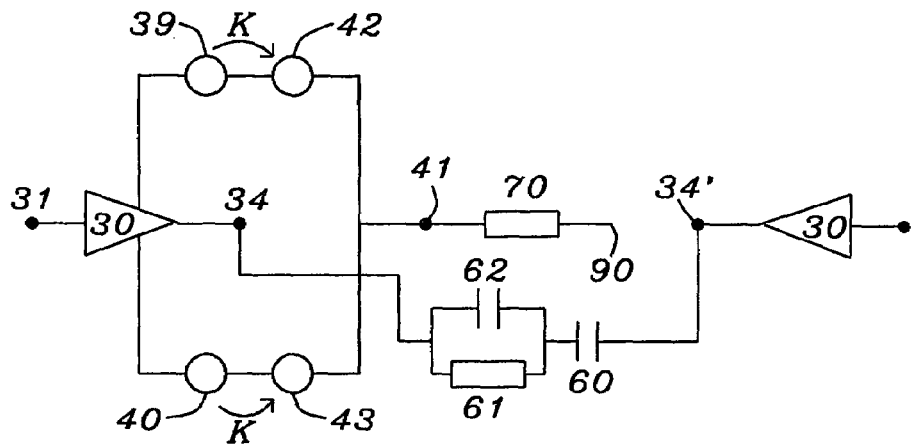
FIG. 10 illustrates the operation and the gain setting of a buffer amplifier having differential and single ended output

Using again the symbolic schematic of the basic amplifier stage invented as shown in FIG. 4A, the gain setting and the operation having a differential input and a single ended output is described in FIG. 10. For said type of operation one complete basic amplifier stage plus another said basic amplifier stage without current mirror and output node is required.

Said second basic amplifier stage comprises an input stage only. It is an identical input stage to the input stage of the complete basic amplifier stage. The signal input is differential between node 31 and node 31'. Each of the input stage comprises two signal paths comprising two source follower transistors each. The signals are combined again at node 34 resp. at node 34'. The output is single ended at node 41. The output load 70 is hooked up between the output node of said basic amplifier stage 41 and node 90. Node 90 can be ground but must be capacitively coupled. The gain and frequency setting components are based between node 34 and node 34' As described earlier the two signal paths of the basic amplifier block are combined in node 34 resp. in node 34' again The capacitor 60 sets the lower frequency, the resistor 61 the mid-band gain and the capacitor 62 is used for widen the bandwidth to higher frequency's or gain peaking at a given frequency. This stage is important for output drivers. Going off chip, the signals are usually single ended. As long as the signals are inside an ASIC the signals are routed differential to minimize crosstalk and substrate coupling. Transferring the signal from differential to single ended, a lot of power is wasted. In the block segmentation invented, the differential signal buffered to node 34 and 34' is generating a current that is mirrored by the two current mirrors 39/42 and 40/43 with the multiplication factor K to the output. So both signals, the inverted and non-inverted input signal are actively used.

For the circuits described, transistors in CMOS technology are typically used. Generally it is possible to use bipolar technology as well. A specific complementary process would be required for bipolar transistors. In comparison to CMOS technology no zero or close to zero $V_t$ transistors are available now. Therefore for CMOS technology, the maximal signal-swing for a given supply voltage is higher compared to a bipolar solution.

Figure 11:
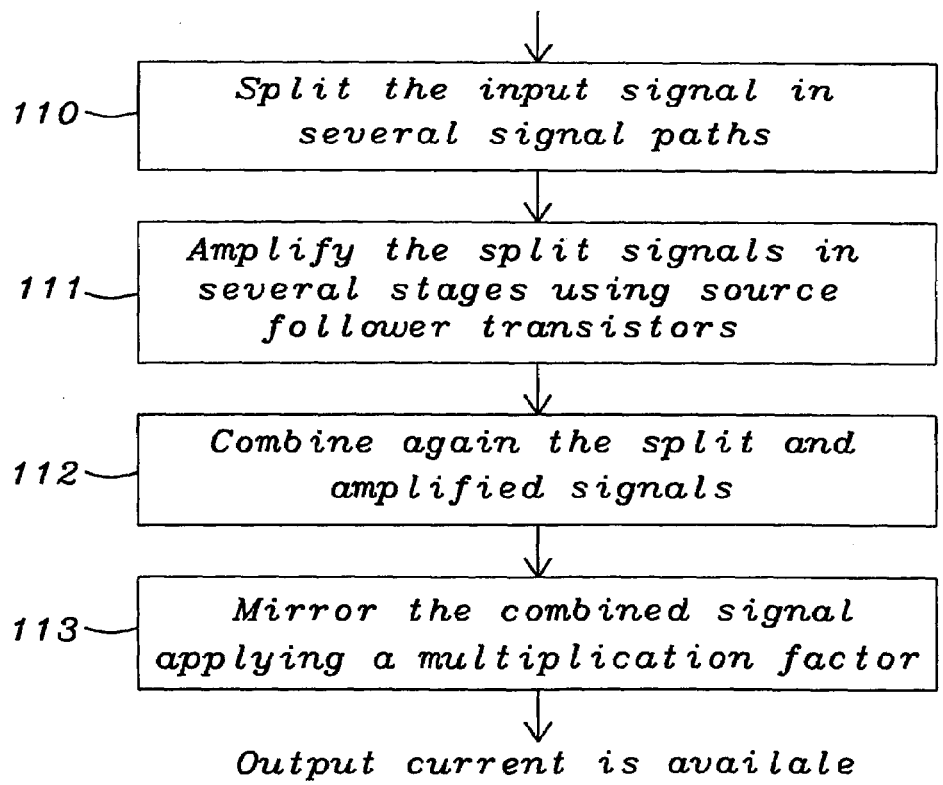
FIG. 11 illustrates a method how to achieve a high isolation and high-speed buffer amplifier.

FIG. 11 illustrates a method how to achieve a high isolation and high-speed buffer amplifier capable to work in the GHz range. Step 110 describes that the input signals are split in several signal paths. The split input signals are being amplified in several stages using source follower transistors as described in step 111. In step 112 the split signals are being combined again. In the next step 113 the signals combined again are mirrored applying a multiplication factor. Using said method a highly isolated amplification can be achieved.

While the invention has been particularly shown and described with reference to the preferred embodiments thereof, it will be understood by those skilled in the art that various changes in form and details may be made without departing from the spirit and scope of the invention.

What is claimed is:

1. A method to achieve a high isolation and high-speed buffer amplifier comprises:
    provide a means to split and to amplify the input signals in several parallel signal paths, a means to mirror the amplified signal to reduce the output load required and to increase the reverse isolation, a means to stabilize the operation, and a capacitor and an additional capacitor parallel to a resistor being hooked up to the node where several signal paths are combined, wherein said capacitors and said resistor are being used to set a frequency dependent gain and to define a frequency bandwidth;
    set a frequency dependent gain;
    set a frequency bandwidth;
    split an input signal in several paths;
    amplify the split signal in each signal path in several stages using source follower transistors;
    combine again the split and amplified signals; and
    mirror the amplified output current applying a multiplication factor.

2. The method of claim 1 wherein said input signal is split in two signal paths.

3. The method of claim 1 wherein said split signal is amplified in two stages.

4. The method of claim 1 wherein two differential input signals are split into several signal paths each and two differential output currents are provided.

5. The method of claim 4 wherein said two differential input signals were split in two signal paths each.

6. The method of claim 4 wherein said split signals are amplified in two stages.

7. The method of claim 1 wherein two differential input signals were split into several signal paths and amplified in several stages in each signal path and one single output current is provided.

8. The method of claim 7 wherein said two differential input signals were split in two signal paths each.

9. The method of claim 7 wherein said split signals are amplified in two stages.

* * * * *